(12) United States Patent
Zuleta et al.

(10) Patent No.: US 7,176,452 B2
(45) Date of Patent: Feb. 13, 2007

(54) MICROFABRICATED BEAM MODULATION DEVICE

(75) Inventors: Ignacio A. Zuleta, Mountain View, CA (US); Richard N. Zare, Stanford, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 0 days.

(21) Appl. No.: 11/107,583

(22) Filed: Apr. 15, 2005

(65) Prior Publication Data

US 2006/0231751 A1 Oct. 19, 2006

(51) Int. Cl.
*H01J 1/46* (2006.01)
*H01L 21/46* (2006.01)
*H01L 23/48* (2006.01)

(52) U.S. Cl. ............... 250/286; 250/287; 250/294; 250/296; 250/299; 250/386; 313/343; 313/333; 313/348

(58) Field of Classification Search ............... 250/286; 313/343

See application file for complete search history.

(56) References Cited

U.S. PATENT DOCUMENTS 3,999,263 A * 12/1976 Marshall et al. ............... 445/36

(Continued)

FOREIGN PATENT DOCUMENTS

GB 2 276 490 A 9/1994

OTHER PUBLICATIONS

C. .J. Dedman et al., "An ion gating, bunching, and potential re-referencing unit", *Review of Scientific Instruments*, vol. 72, No. 7, 2001 American Institute of Physics (8 pages).

(Continued)

*Primary Examiner*—Nikita Wells
*Assistant Examiner*—Bernard Souw
(74) *Attorney, Agent, or Firm*—Parsons Hsue & de Runtz LLP

(57) ABSTRACT

A beam modulation device gate is constructed from a silicon material, such as a silicon layer on an silicon on insulator wafer. The device further comprises a set of electrical contacts on the layer. The layer defines a set of electrically conducting silicon material fingers forming an array, wherein each of at least some of the fingers is connected electrically to one of the electrical contacts. The gate may be used in a mass or ion mobility spectrometer. Where the gate is constructed from a silicon on insulator wafer, an insulator layer supports the silicon layer and a handle layer supports the insulator layer. When predetermined electrical potentials are applied to the electrical contacts, at least some of the fingers will be substantially at said predetermined electrical potentials to modulate a beam of charged particles that passes through said array of fingers. A plurality of devices of the type above may be used, where each of the devices modulates the beam so that the beam is deflected along a direction different from direction along which the beam is deflected by any of the remaining devices. A plurality of devices of the type above may be used for a mass gate or charged particle buncher device. For making an ion optical device, an array of fingers is formed in a silicon layer of the silicon on insulator wafer. A portion of a handle layer of the wafer on a side of an insulator layer of the wafer opposite to that of the fingers is removed; and a portion of the insulator layer is removed so that the fingers are connected to the wafer only through the silicon layer and at one end of the fingers.

22 Claims, 12 Drawing Sheets

U.S. PATENT DOCUMENTS

| | | | |
|---|---|---|---|
| 4,150,319 | A * | 4/1979 | Nowak et al. ............... 313/348 |
| 4,524,278 | A * | 6/1985 | Le Poole .................... 250/398 |
| 5,280,175 | A * | 1/1994 | Karl ........................... 250/287 |
| 5,465,480 | A | 11/1995 | Karl et al. |
| 5,486,697 | A | 1/1996 | Stalder et al. |
| 5,696,375 | A | 12/1997 | Park et al. |
| 5,986,258 | A | 11/1999 | Park |
| 6,300,626 | B1 | 10/2001 | Brock et al. |
| 6,356,014 | B2 * | 3/2002 | Xu et al. .................... 313/497 |
| 6,661,001 | B2 | 12/2003 | Park |
| 6,664,545 | B2 * | 12/2003 | Kimmel et al. ......... 250/396 R |
| 6,781,120 | B2 * | 8/2004 | LeCursi et al. ............. 250/286 |
| 6,870,157 | B1 | 3/2005 | Zare |
| 2003/0048059 | A1 * | 3/2003 | LeCursi et al. ............. 313/348 |
| 2003/0146392 | A1 * | 8/2003 | Kimmel et al. ......... 250/396 R |
| 2004/0144918 | A1 * | 7/2004 | Zare et al. .................. 250/287 |
| 2005/0102829 | A1 * | 5/2005 | LeCursi et al. ............... 29/847 |
| 2005/0151075 | A1 * | 7/2005 | Brown et al. ............... 250/290 |
| 2005/0258514 | A1 * | 11/2005 | Smith et al. ................ 257/619 |
| 2006/0024720 | A1 * | 2/2006 | McLean et al. ................ 435/6 |

OTHER PUBLICATIONS

C. K. G. Piyadasa, "A High Resolving Power Ion Selector for Post-source Decay Measurements in a Reflecting Time of Flight Mass Spectrometer", *Rapid Commun. Mass Spectrom.*, pp. 1655-1664 (1998).

T. H .P. Chang, et al., "Microminiaturization of electron optical systems",*J. Vac. Sci. Technol.* B8 (6) Nov./Dec. 1990, American Vacuum Society (4 pages).

M. Despont et al., "Fabrication of an integrated Silicon-Based Lens for Low-Energy Miniaturized Electron Columns",*Jpn. J. Appl. Phys.* vol. 35, Part 1, No. 12B, Dec. 1996 (8 pages).

K. Y. Lee et al., "High aspect ratio aligned multilayer microstructure fabrication", *J. Vac. Sci. Technol.* B12(6), Nov./Dec. 1994 (6 pages).

Beussman, D. J., et al., "Tandem Reflectron Time-of-Flight Mass Spectrometer Utilizing Photodissociation", *Analytical Chemistry*, vol. 67, No. 21, Nov. 1, 1995 (7 pages).

E. Kratschmer et al., "Experimental evaluation of a 20×20 mm footprint microcolumn", *J. Vac. Sci Technol.*, B14(6), Nov./Dec. 1996 (5 pages).

Y. Nakayama et al., "Electron-beam cell projection lithography: A new high-throughput electron-beam direct-writing technology using a specially tailored Si aperture",*J. Vac. Sci. Technol.* B6(6), Nov./Dec. 1990 (5 pages).

G. I. Winograd, "A Multi-Blanker for Parallel Electron Beam Lithography", May 2001, Solid State Electronics Laboratories, Stanford University Stanford, CA (141 pages).

I. Zuleta et al., Microfabricated Beam Modulation Devices (BMD) for Multi-Anode Multiplexing Time of Flight Mass Spectrometry (TOF-MS), 52nd ASMA Conference on Mass Spectrometry, May 23-27, 2004, Nashville, Tennessee, www.asms.org (20 pages).

O. Trapp, et al., "Continuous Two-Channel Time of Flight Mass Spectrometric Detection of Electrospayed Ions", *Angew. Chem. Int. Ed.*, vol. 43, Received Jul. 8, 2004, Wiley-VCH Verlag GmbH & Co. KgaA Weinheim; pp. 6541-6544, www.angewandte.org (4 pages).

* cited by examiner

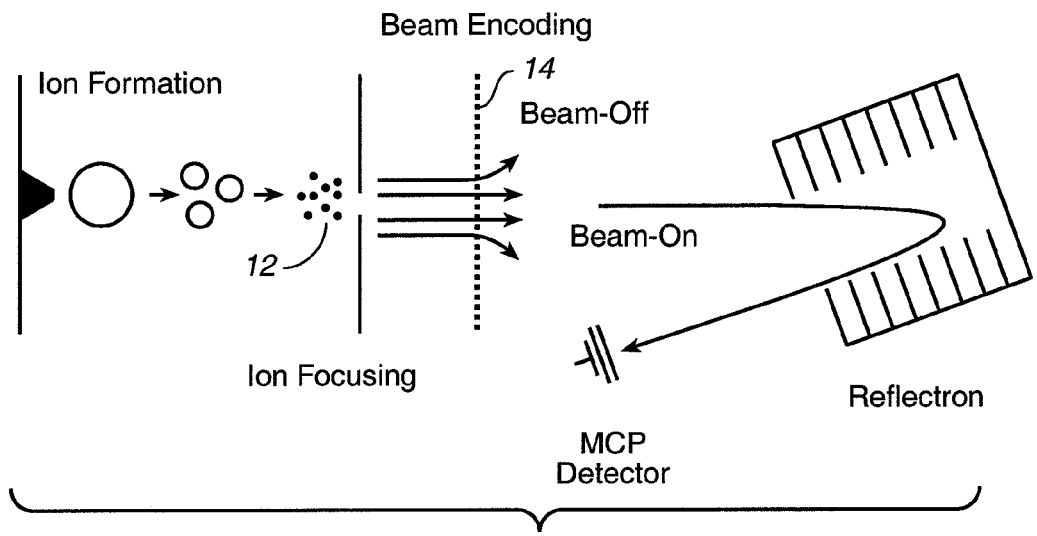
FIG._1a
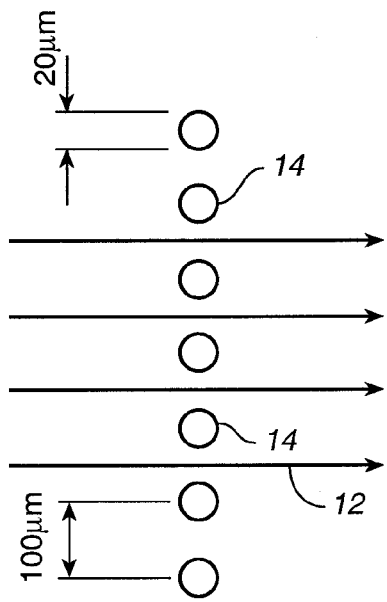
FIG._1b
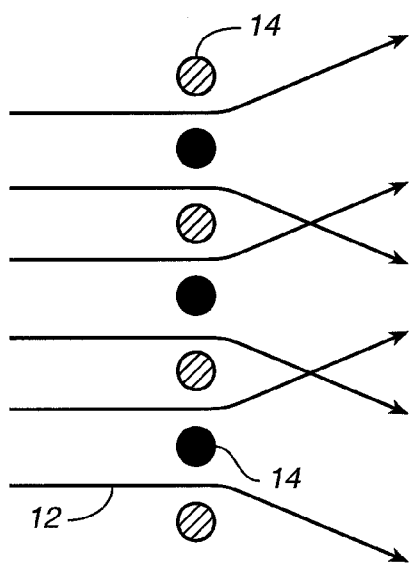
FIG._1c

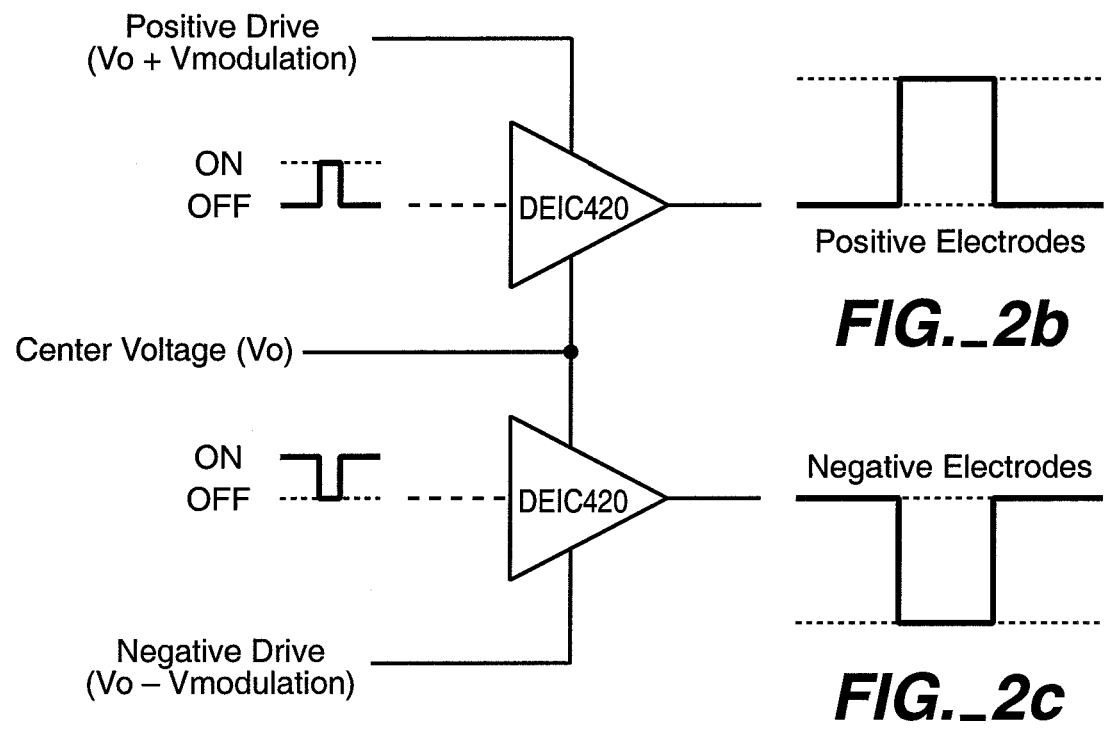
FIG._2a
FIG._2b
FIG._2c
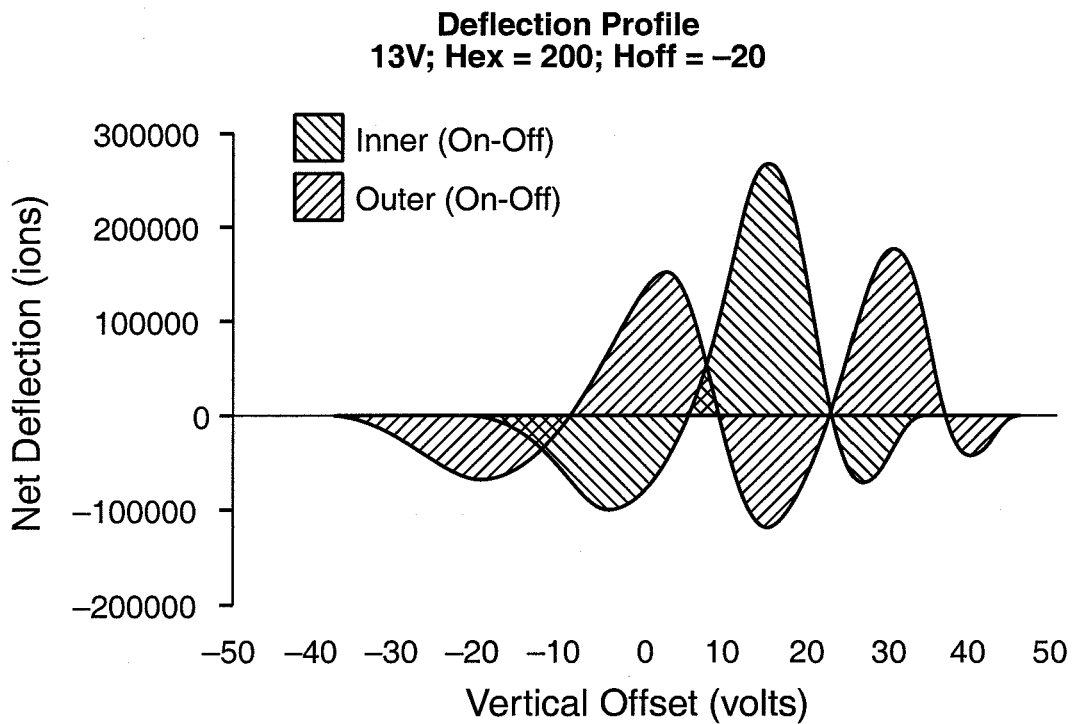
FIG._3

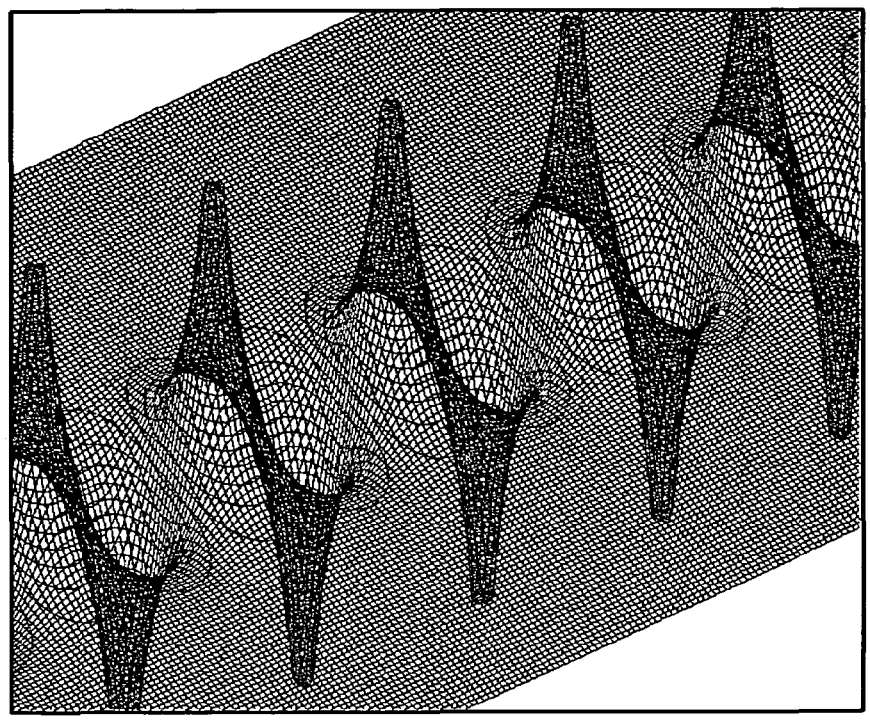
FIG._4
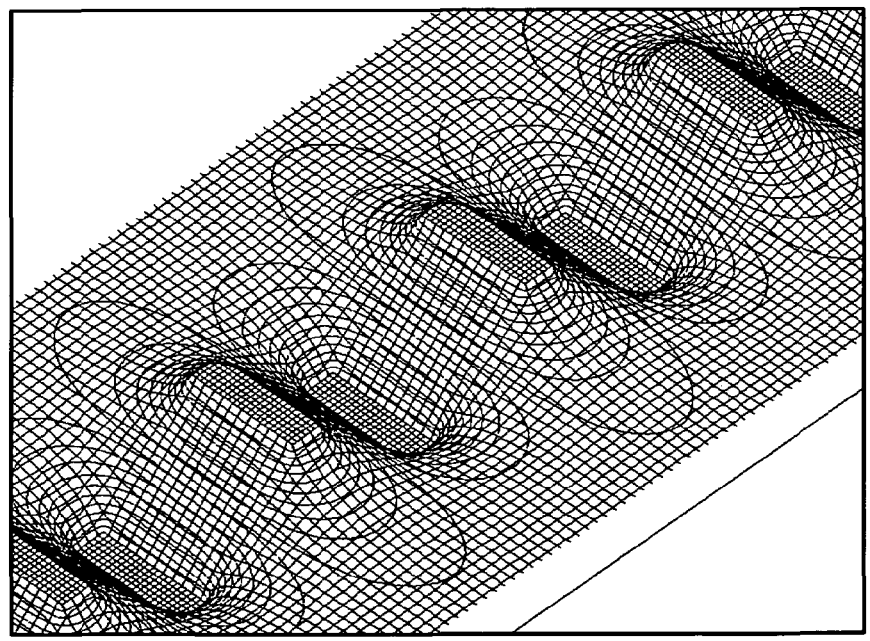
FIG._5

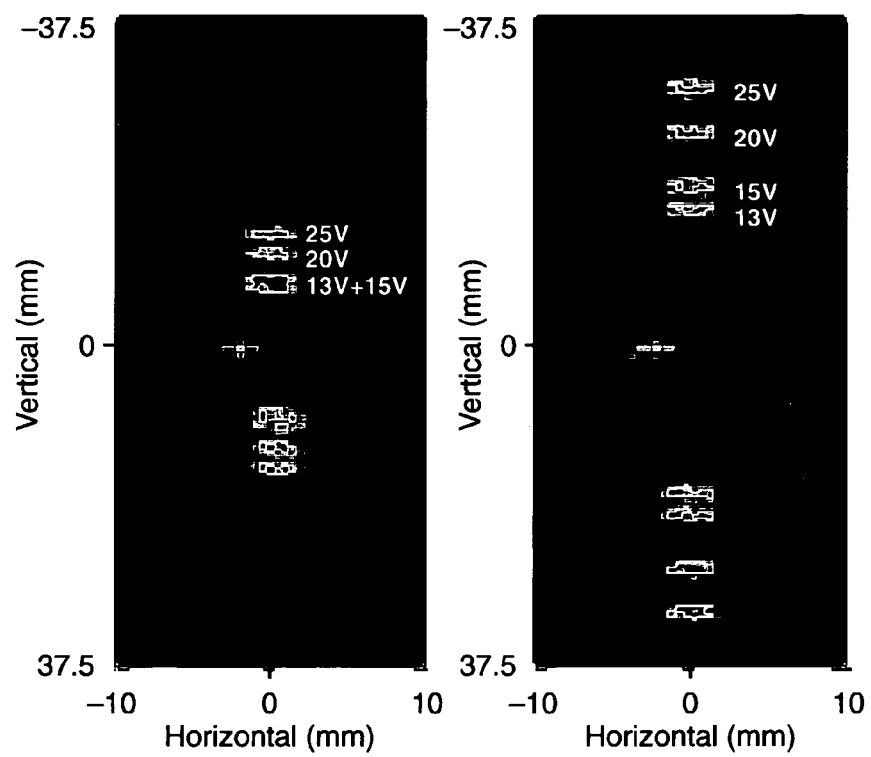
FIG._6a  FIG._6b
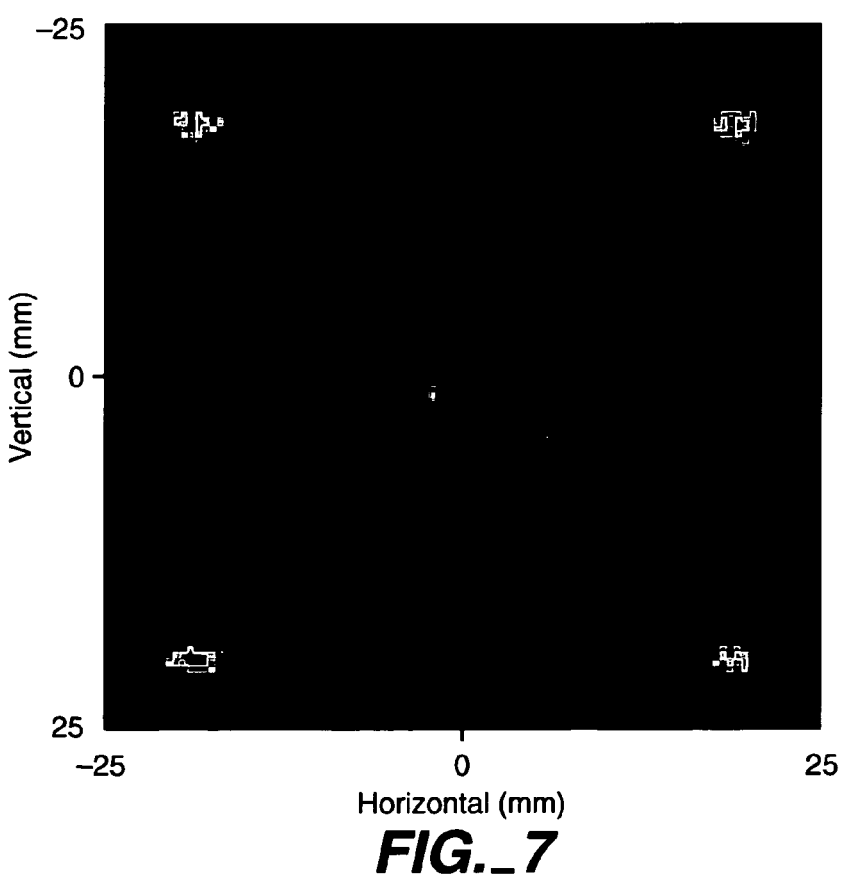
FIG._7

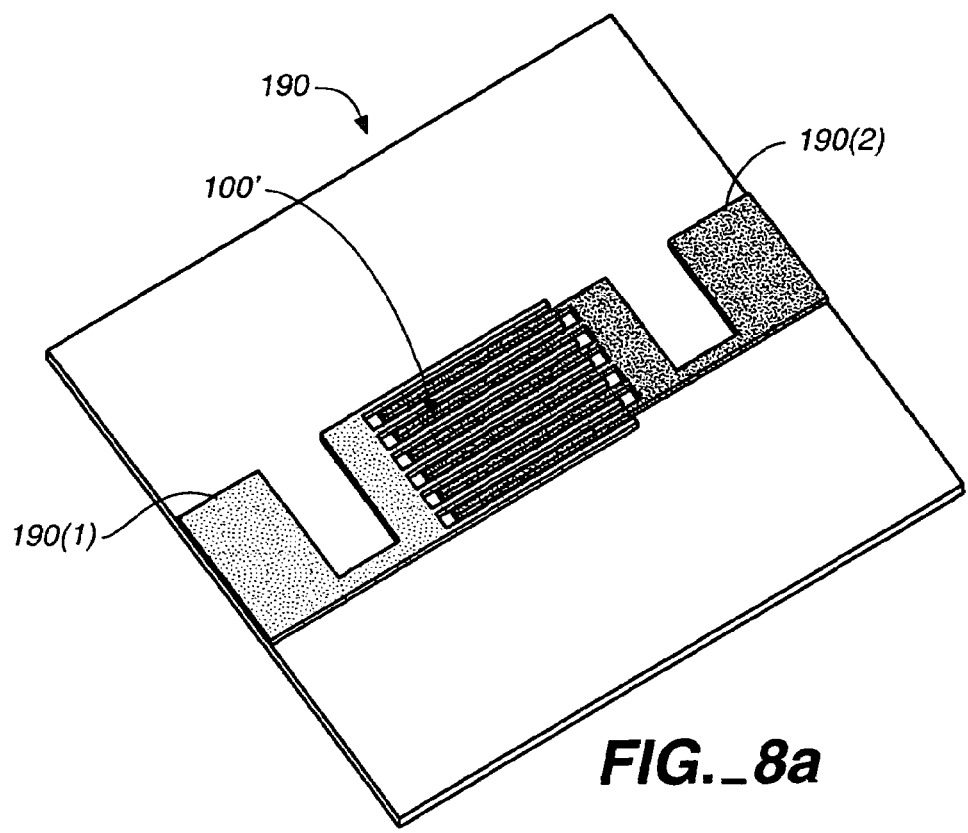
FIG._8a
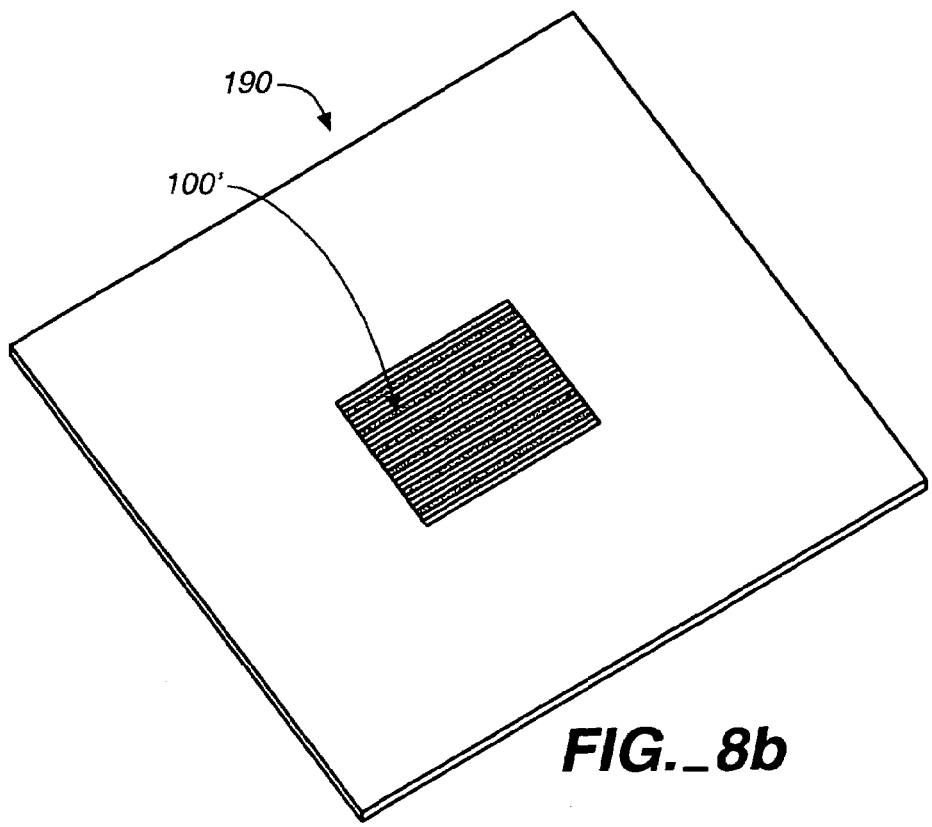
FIG._8b

FIG._9a
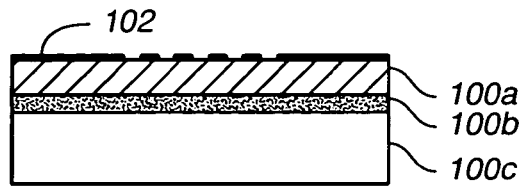
FIG._9b
Deep Reactive Ion Etching (DRIE) of device layer
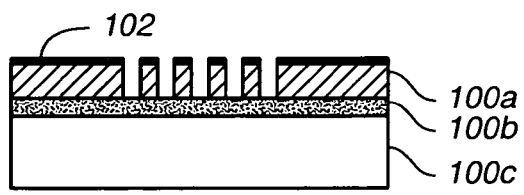
FIG._9c
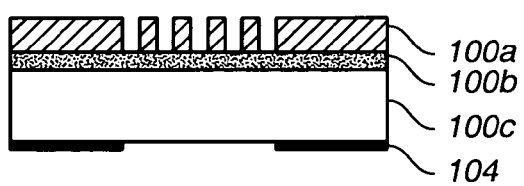
FIG._9d
DRIE of Release Window
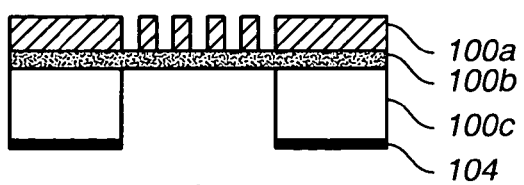
FIG._9e
HF wet etching of sacrificial layer: final release of structure

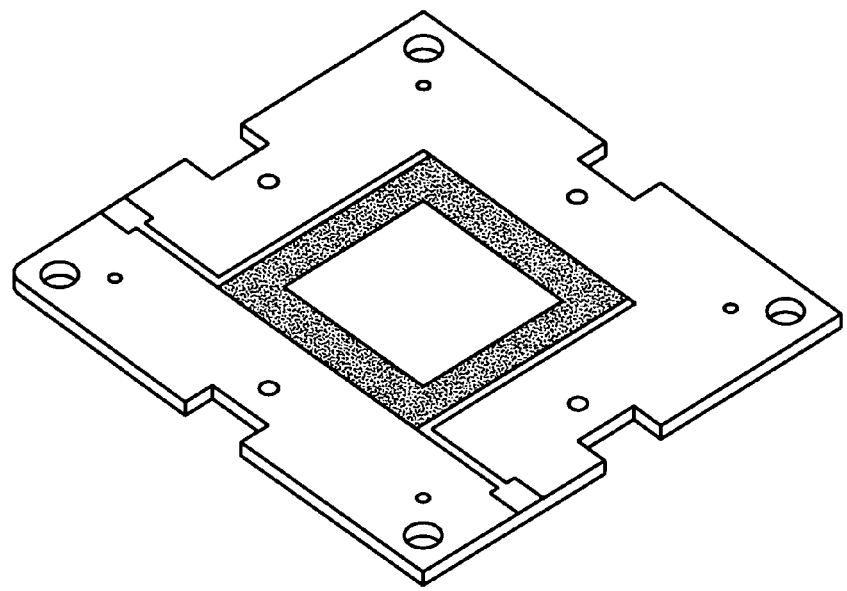
FIG._10a
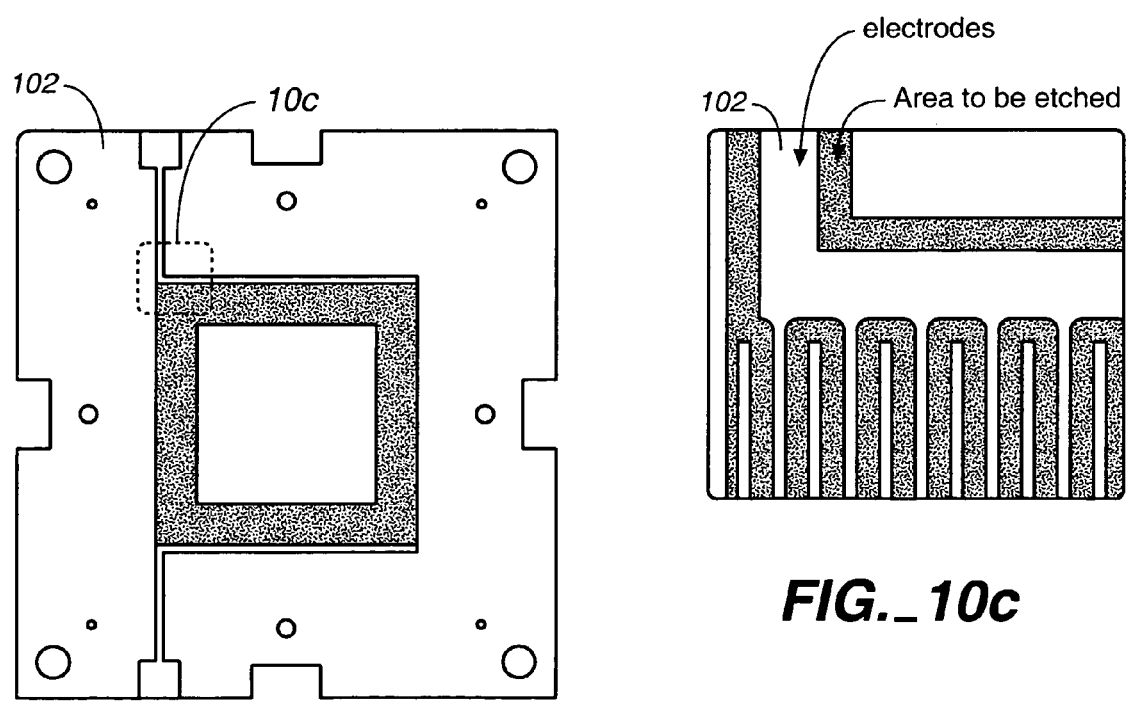
FIG._10b
FIG._10c

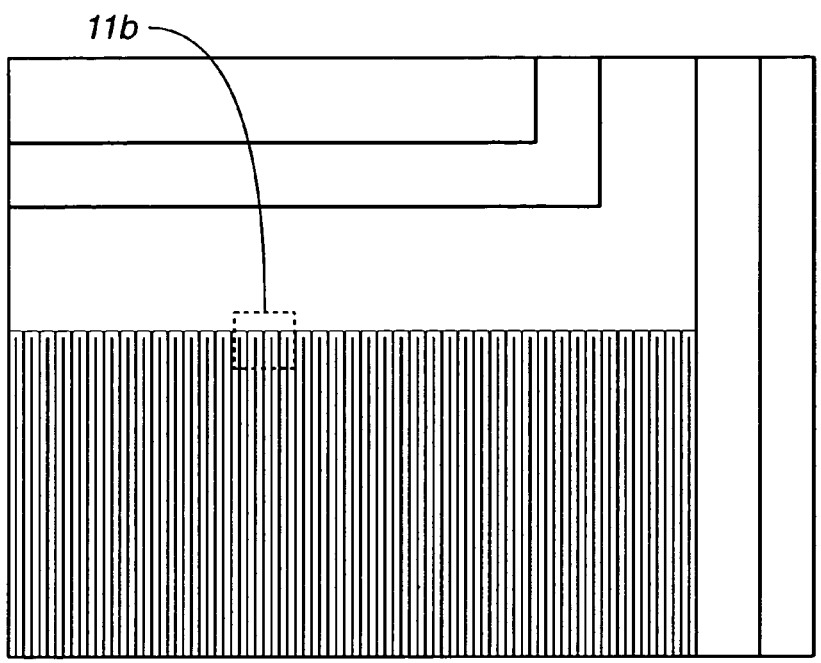
FIG._11a
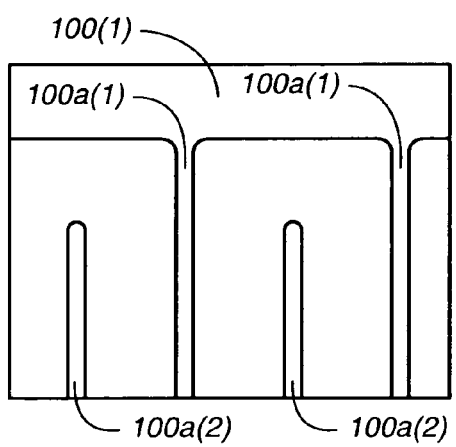
FIG._11b
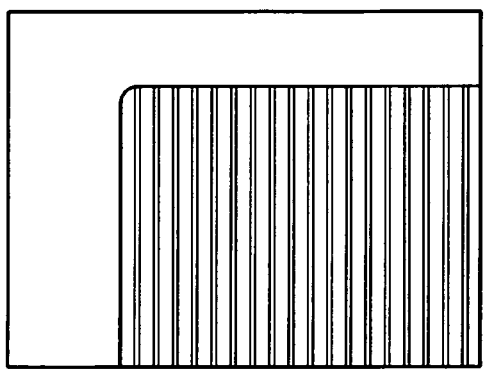
FIG._12a
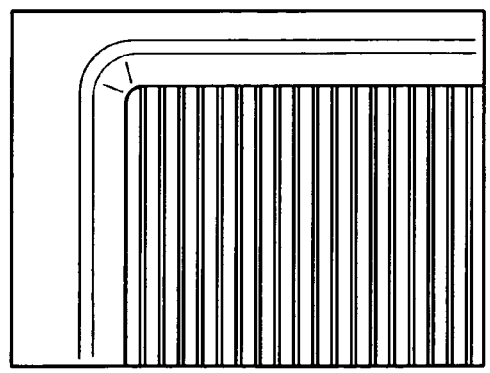
FIG._12b

FIG._13a
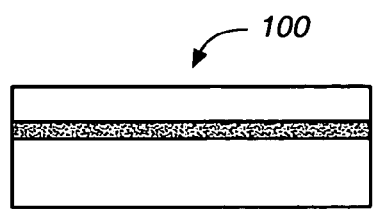
↓ METAL COATING
FIG._13b
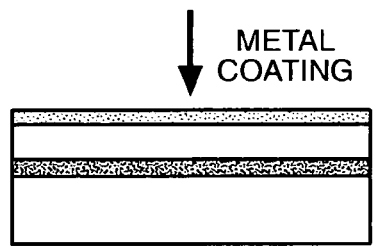
↓ TOPSIDE LITHO
FIG._13c
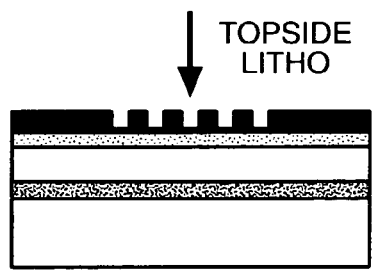
↓ METAL ETCHING
FIG._13d
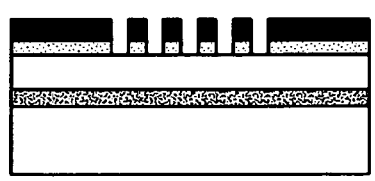
↓ TOPSIDE DRIE
FIG._13e
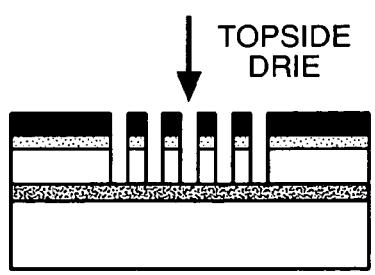
↓ RESIST COATING
FIG._13f
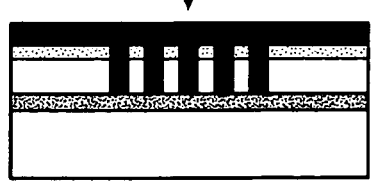

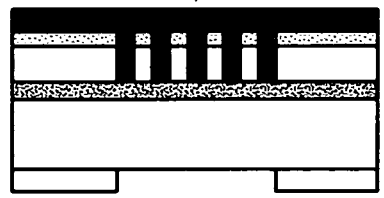
FIG._13f
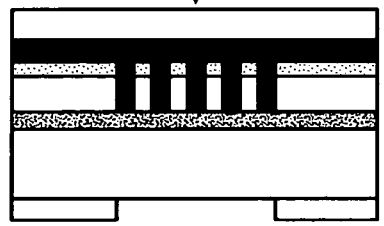
FIG._13g
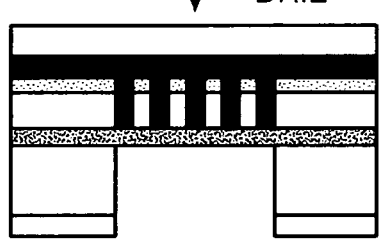
FIG._13h
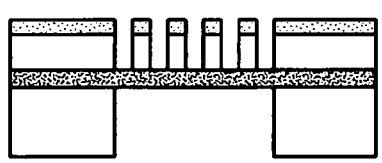
FIG._13i
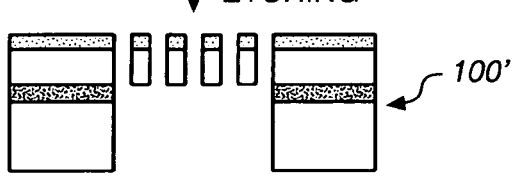
FIG._13j

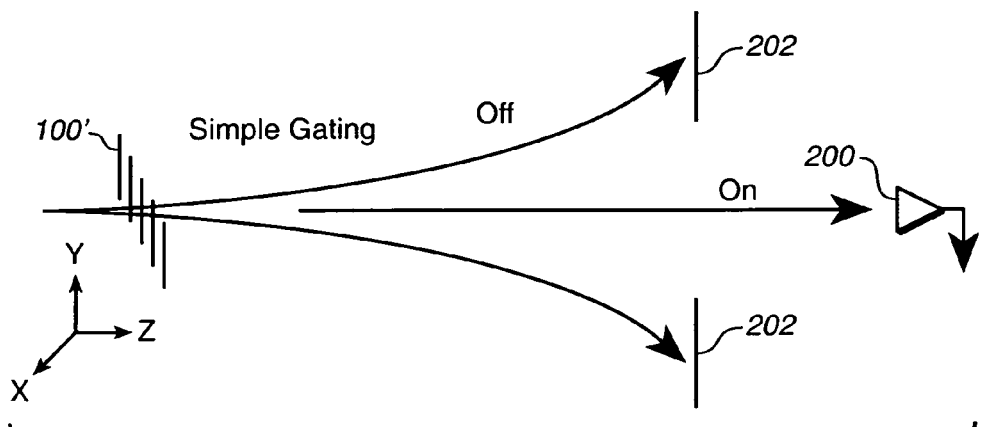
FIG._14
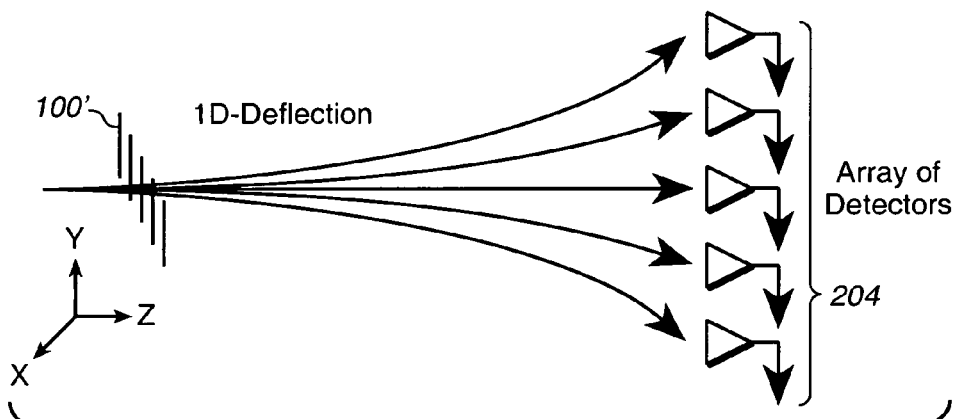
FIG._15
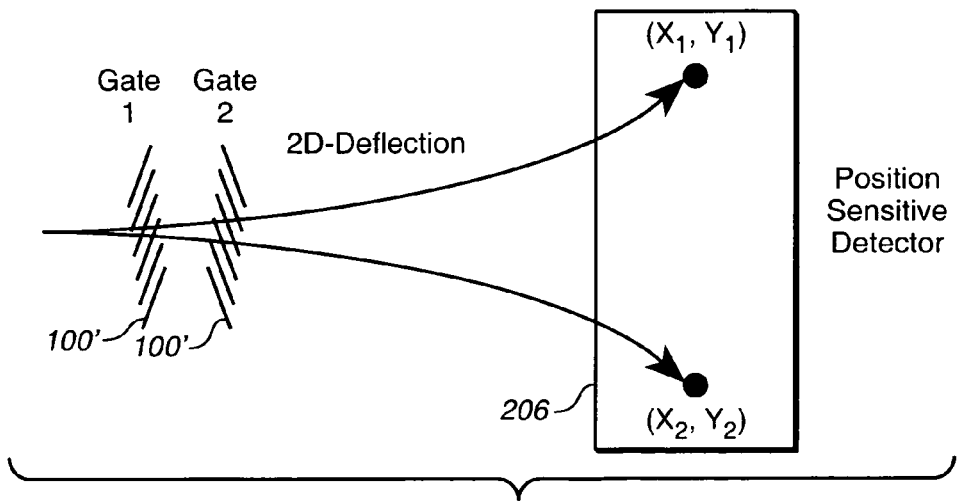
FIG._16

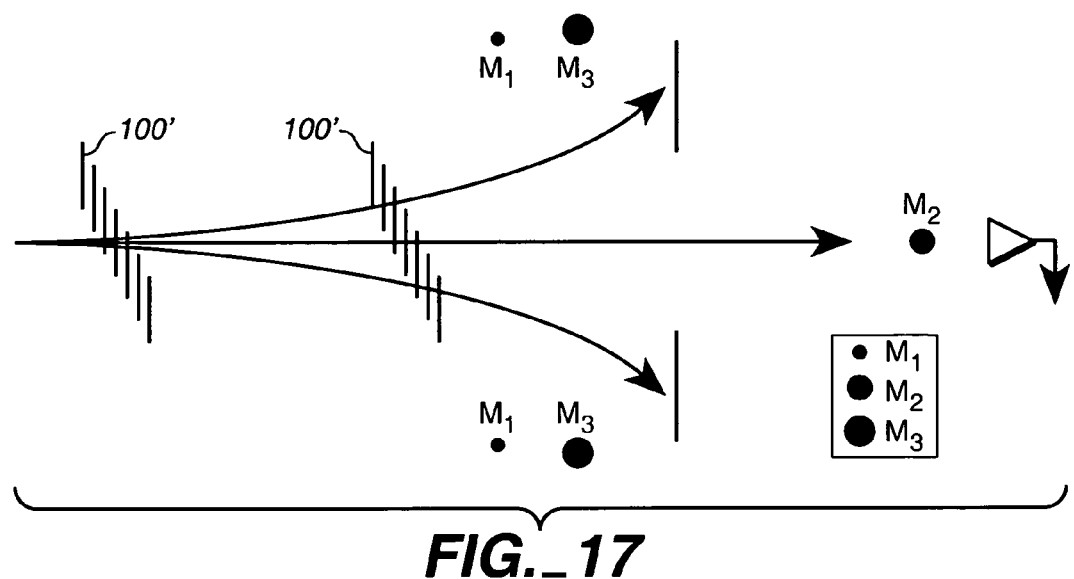
FIG._17
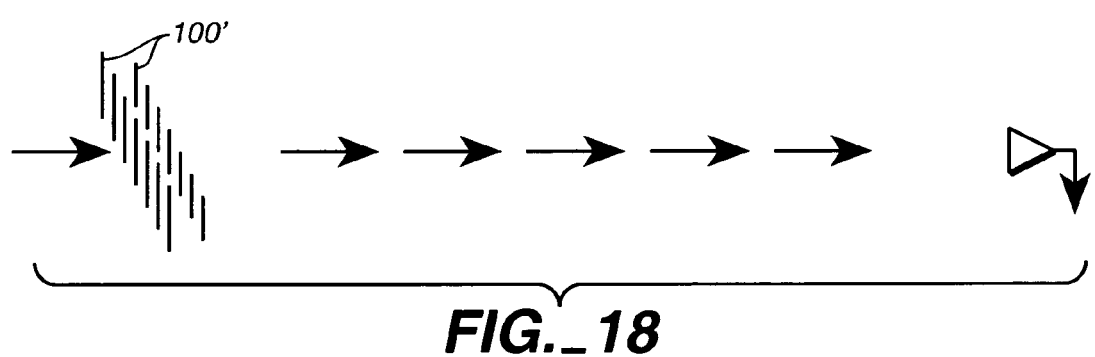
FIG._18
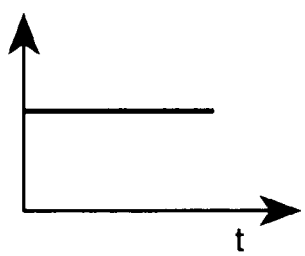
FIG._19a
FIG._19b

MICROFABRICATED BEAM MODULATION DEVICE

This invention was supported in part by an Air Force Office of Science Grant number AF03T003. The United States Government has rights in this invention.

FIELD OF THE INVENTION

This invention relates in general to devices and techniques for modulating beams of charged particles, and in particular to such devices and techniques that employ microfabrication to make the devices.

BACKGROUND OF THE INVENTION

Time-of-flight mass spectrometry (TOFMS) is an inexpensive analytical technique that has become the preferred choice for monitoring a variety of chemical separation processes that require mass discrimination. In one TOFMS technique that circumvents the problems associated with pulsing continuous ion beams, called Hadamard transform time-of-flight mass spectrometry (HT-TOFMS), ion sources are continuously monitored with an intrinsic duty cycle of 50% over any mass range. This technique is described in U.S. Pat. No. 6,300,626. A similar technique where the ion beam is deflected in both the "on" and "off" states is described in U.S. Pat. No. 6,870,157. With only a few exceptions, the instrumental set-up is identical to conventional TOFMS instruments. Because of its inherent high duty cycle, uncompromised choice of mass range, and absence of time-varying high voltages (low voltage pulsing), HT-TOFMS holds the promise of being miniaturized into a rugged instrument capable of field operation.

In a HT-TOFMS experiment, ions 12 entering the spectrometer are focused onto a Bradbury-Nielson gate (BNG) 14, consisting of a two interspersed wire sets as shown in FIG. 1a. As shown in FIG. 1a, in the "on" state, the ions are not deflected, and are directed to inner detector area(s) on the MCP detector after reflection by the reflectron. In the "off" state, the ions are deflected optionally to the outer area(s) on the MCP detector (the amount of deflection being exaggerated in FIG. 1a). FIGS. 1b and 1c describe the principle under which the ion gate operates: the gate's deflection voltage is rapidly modulated 'on' and 'off' with a known sequence, creating small packets of ions. Principle of operation of a Bradbury-Nielsen ion gate is illustrated in FIG. 1b when the two interleaved wire sets are at the same voltage, ions fly unaffected through the gate, and FIG. 1c when a bias voltage is applied to the two wire sets, ions are deflected off the propagation axis. Multiple ion packets (constituting 50% of the total number of ions) enter the flight chamber during a single scan and interpenetrate one another as they fly toward the detector. The acquired signal, which is the superposition of all the packets' spectra, is deconvoluted using knowledge of the applied modulation sequence. The recovered signal is equivalent to conventional time-of-flight (TOF) spectrum, but now has a dramatically improved signal-to-noise ratio (SNR) owing to the multiplexing scheme. Because of the inherent high duty cycle and the rate of the modulation, HT-TOFMS usually offers scan speeds that are higher than any other form of TOFMS. For a more detailed description of the technique, please see U.S. Pat. No. 6,300,626. Because of these advantages, it is expected that HT-TOFMS will soon be a commonly used technique.

A Bradbury-Nielsen gate shutters the ion beam "on" and "off" by applying a 10 MHz sequence of square voltage pulses to the wire set.; The integrity of the multiplexing scheme depends on the discrete, accurate modulation of the beam; the performance of the gate is thus crucial. Bradbury-Nielson gates are used in a multitude of MS and ion mobility analyzers, but few of these applications have the temporal requirements of HT-TOFMS.

Because the deflection efficiency and temporal resolution of these gates depends on the spacing between wires, extensive efforts have been made to develop new methods for producing gates with finely spaced wires. The quality of recorded mass spectra is limited by the ability of the BNG to control the trajectory of the ion beam. Therefore, efforts are underway to optimize the dimensions, ruggedness, and deflection efficiency of the BNG. In particular, a beam modulation device ("BMD") is desired with fine interelectrode spacing that can be manufactured in high volume. In order to improve mass resolution and modulation pulse profiles, much effort has been made to produce Bradbury-Nielson gates with minimal spacing between wires. A detailed description of the use of this device in time-of-flight mass spectrometry appeared in 1995 by Viasak et al. See "An interleaved comb ion deflection gate for m/z selection in time-of-flight mass spectrometry," by P. R. Vlasak et al., Rev. Sci Instrum., 1996, 67, 68–72. In this work, a wire spacing of 1 mm was achieved by weaving a wire through holes on two separate frames and applying tension with a bracing screw between the two frames. A significant reduction of the wire spacing to 0.5 mm was reported in 1998 by Stoermer et al. who used the grooves on two nylon threads to control the wire spacing. This group used two sequential grids to minimize pulse widths. Still, they concluded that further reduction in wire spacing would improve m/z selectivity in TOF experiments.

The next advance in the reduction of the wire spacings was reported by Brock, Rodriguez, and Zare, who were able to construct Bradbury-Nielsen gates for their HTM-TOF mass spectrometer with a wire spacing of 0.16 mm, working by hand under a microscope to set the wires in a frame made from a piece of printed circuit board (PCB) and aligned by means of two threaded rods fixed to opposite ends of the PCB. This procedure was extremely laborious, requiring several days to complete the assembly of a single gate. Furthermore, the frames were expensive and the quality of the fabricated grids was inconsistent. Another technique is described in U.S. Pat. No. 6,664,545, where a surface with grooves thereon is employed for guiding a wire that is being wound around it to construct the BNG.

All of the above techniques are limited in how closely together the wires can be fixed in position, and hence also the resulting resolution that can be achieved. It is therefore desirable to provide improved BNG and other gates used in a BMD for modulating a beam of charged particles, and an improved method for making these gates.

SUMMARY OF INVENTION

In one aspect of the invention, a BMD gate is constructed from a silicon material. One embodiment may comprise a layer of silicon material; and a set of electrical contacts on the layer, said layer defining a set of electrically conducting silicon material fingers forming an array, wherein each of at least some of the fingers is connected electrically to one of the electrical contacts. The gate may be used in a mass or ion mobility spectrometer.

In one embodiment, the gate is constructed from a silicon on insulator wafer. In such instance, the gate may comprise a layer of silicon material, a set of electrical contacts on the layer, said layer defining a set of electrically conducting silicon material fingers forming an array, wherein each of at least some of the fingers is connected electrically to one of the electrical contacts, an insulator layer supporting said silicon layer and a handle layer supporting said insulator layer, so that when predetermined electrical potentials are applied to the electrical contacts, the at least some of the fingers will be substantially at said predetermined electrical potentials to modulate a beam of charged particles that passes through said array of fingers.

According to another aspect of the invention, a plurality of devices of the type above may be used, where each of the devices modulates the beam so that the beam is deflected along a direction different from direction along which the beam is deflected by any of the remaining devices.

According to yet another aspect of the invention, a plurality of devices of the type above may be used, so that substantially only particles with a predetermined mass will pass through the plurality of devices.

According to still another aspect of the invention, a plurality of devices of the type above may be used, so that bunches of particles pass intermittently through the plurality of devices.

The above features may be used individually or in combination.

Yet another aspect is directed to a method for making an ion optical device. An array of fingers is formed in a silicon layer of the silicon on insulator wafer. A portion of a handle layer of the wafer on a side of an insulator layer of the wafer opposite to that of the fingers is removed; and a portion of the insulator layer is removed so that the fingers are connected to the wafer only through the silicon layer and at one end of the fingers.

BRIEF DESCRIPTION OF THE DRAWINGS

FIG. 1a is a schematic diagram of a TOFMS apparatus to illustrate one embodiment of the invention.

FIGS. 1b and 1c are schematic views of the charged particle beam and BNG gate (or more generally a BMD) to illustrate principle of operation of the apparatus of FIG. 1a. FIG. 1a illustrates the operation when the two interleaved wire sets are at the same voltage, ions fly unaffected through the gate, and FIG. 1b illustrates the operation when a bias voltage is applied to the two wire sets, where ions are deflected off the propagation axis.

FIG. 2a is a schematic circuit diagram of a H-bridge used to drive the Beam Modulation Device(BMD), such as the BNG of FIG. 1a. FIGS. 2b and 2c are timing diagrams illustrating the waveforms of voltages at the outputs of the H-bridge of FIG. 2a.

FIG. 3 is a graphical plot of the Difference of counts between deflected and undeflected ion beams, as detected by the inner and outer detector active areas in FIG. 1a. Positive values indicate modulation modes in which there are more counts in the "on" state that in the "off" state. As we sweep across the detectors, our modulation efficiency varies due to the progressive change in overlap of the ion beam with either detector.

FIG. 4 is a graphical plot of the potential energy surface calculated for the 100 mm BNG gate.

FIG. 5 is a graphical plot of the potential energy surface calculated for the 25 mm micromachined BNG gate.

FIGS. 6a and 6b are simulated images of deflected 1.5 keV ion beams for different modulation voltages passing through respectively a 100 mm Bradbury-Nielsen gate and a 25 mm microfabricated gate.

FIG. 7 is a simulated image of a 1.5 keV ion beam using two stacked 25 mm Micro-fabricated gates at 13 V deflection voltages.

FIGS. 8a, 8b are views of the front and back side of a BMD, to illustrate one embodiment of the invention.

FIGS. 9a–9e are cross-sectional views of a silicon-on-insulator wafer undergoing processing, forming a flow chart illustrating an overall microfabrication process flow.

FIG. 10a is a perspective view of a mechanical design of a Beam Modulation device (not including wires). FIGS. 10b and 10c are schematic views of a mask design for the same device, where FIG. 10c is an exploded view of the portion 10c in FIG. 10b.

FIGS. 11a and 11b show in detail the resulting structures after etching the electrodes on the top using $SiO_2$ layer 100b as an etch stop using the mask of FIGS. 10b and 10c. FIG. 11b is an exploded view of a portion 11b of the mask in FIG. 11a.

FIGS. 12a and 12b show the backside of the device when the oxide and the resist have not been stripped.

FIGS. 13a–13j are cross-sectional views of a silicon-on-insulator wafer undergoing processing, forming a flow chart illustrating a more complete overall fabrication process for new beam modulation devices.

FIGS. 14–19b are schematic views of systems using the above-illustrated micromachined charged particle optical device or BMD.

For simplicity in description, identical components are labeled by the same numerals.

DETAILED DESCRIPTION OF THE PREFERRED EMBODIMENTS

Electrical Specifications

The driving electronics for this application have been developed specifically for high speed electrostatic deflection. The deflection drive system consists of a fast H-bridge that can be floated to any arbitrary voltage allowed by the decoupling electronics, in our current implementation, from ground to 1500V. Digital TTL level signals to drive the bridge are generated using a PLD device and transported to the inside of the instrument using low voltage differential signaling (LVDS). FIG. 2 shows the switching scheme. Software-controlled high voltage power supplies are used to derive the float voltage and the positive and negative drive voltages. At the heart of the bridge is a high-speed MOSFET gate driver IC, DEIC420, designed to switch a 1000 pF load from 0 to 25 V in less than 5 ns. The tracks or cabling between the driver and the BMD are wide and as short as possible. The electrical constraints can be summarized as follows: 1000 pF max capacitance and ±25 V max switch voltage.

Optical Specifications

The optical and mechanical specifications are closely related. The desired feature size is dictated by the optical properties of the BMD. The device can deflect a 3 mm wide ion beam when the lowest voltage that can be applied by the current driving electronics, ±13 V, is used. Some calculated optical properties of both, the current handcrafted Bradbury-Nielsen Gate and the proposed BMD, are compared in the table below for 1 KeV ions of m/z 1000 hitting a detector 1 m away. As can be seen, reduction in physical dimensions increases the overall sensitivity of the deflection system, while other parameters do not show notable improvements from feature reduction alone (Table 1).

TABLE 1

Comparison of some figures of merit for
a normal BNG and a microfabricated BNG.

| Parameters | BNG | μ-BNG |
|---|---|---|
| Deflection Voltage (V) | ±13 | ±13 |
| Space Between Electrodes (μm) | 100 | 25 |
| Electrode Width (μm) | 20* | 5 |
| Electrode Depth (μm) | 20* | 20 |
| Active area (mm$^2$) | 460 | 25 |
| Field strength (V/m) | $3 \times 10^5$ | $1 \times 10^6$ |
| Vertical Displacement at 1 m (mm) | 6.5 | 15 |
| Transmission (%) | 80 | 80 |
| Capacitance (pF) | 10.1 | 5.6 |
| Speed** (MHz) | 15.5 | 15.5 |

*BNG wires have circular cross-section.
**Speed at which a mass 1000 ion transit time becomes comparable to switch time.

An ion beam can be vertically steered across two detectors using custom-designed modulation electronics. Switching the ion beam from the "on" state to the "off" state moves the ion beam from one detector to the other, as can be observed in FIG. 3. This was acquired using a normal BNG, which exhibits less than half the predicted deflection power than that of a microfabricated BNG.

To compare the performance of a normal and a microfabricated BNG (μ-BNG), ray tracing simulations were carried out using SIMION 7.0. FIGS. 4 and 5 show the potential energy surfaces for these two deflections systems. As can be seen, the main advantages of these deflection systems lie in the localized electrode electrical fields which quickly cancel out as we leave the deflection area. Also, because of their closeness, the field strengths that can be achieved for a given voltage are as intense as $3\times10^5$ V/m and $10^6$ V/m, respectively. Even for very conservatively chosen dimensions, microfabricated gates exhibit a dramatically improved deflection and linearity of the electrical field between electrodes.

SIMION 7.0 simulated beam images, for 4 mm diameter Gaussian beams of 5 eV energy spread, are shown in FIGS. 6 and 7. In FIG. 4 the performance of new and old types of BNGs are compared, and the increased deflection due to closer inter-electrode spacing can be seen. In FIG. 5, as an example, beam splitting by two stacked microfabricated BNGs is shown. Highly integrated ion optics could be micromachined this way, the potential for an integrated 2D beam steering—splitter system can be appreciated here. Using the same approach several optical elements can be integrated including, but not limited to, correction lenses, limiting apertures, and periodic focusing systems.

Mechanical Design and Fabrication

Introduction

In order to microfabricate the new Beam Modulation Devices we undertook the design of a series of microfabrication steps. Such succession of microfabrication steps is usually called a process flow. Optimization of a process flow to obtain a desired structure is often the most challenging stage in this process. The fabrication strategy and the device's mechanical design on the fly are reassessed to accommodate experimental behavior of the substrate in each fabrication stage. As part of this process, each fabrication step is assayed on structures resembling our real substrate, in a series of dry runs of the process flow. Once the process flow matures into a feasible strategy, complete runs are carried over to obtain the desired structures.

These devices present a myriad of challenges for manufacturing, the most important being the construction of two 2.5D (2D structures with limited extent in a third dimension) free standing structures that are conductive and can be controlled independently (electrically isolated from each other). The whole assembly visible to the ion beam should be conductive, so as to prevent charging of surfaces and should be dimensioned so it can be mounted on existing instruments. Our target structure, essentially consisting of two free-standing inter-digitated capacitors (IDC), is shown in FIGS. 8a and 8b, which are views of front and back sides of a microfabricated BMD. These devices are mounted on a Si handle, but are electrically isolated from it. The Si body provides a ground plane and hides the electrical field generated by the connection pads from the ions.

Based on a review of available MEMS fabrication technologies, we decided to machine the new beam modulation device employing Silicon-on-Insulation (SIO) bulk micromachining technology. SOI wafers consist of a three layers: a thin Si "device" layer (10–50 μm), usually a few micron thick, an insulating "buried oxide" $SiO_2$ layer (0.01–2 μm), and a thick Si "handle" (400 μm). This arrangement present several advantages: First, a device can easily be constructed on the top and at the same time kept electrically insulated from the "handle". Also the fact that conductive Si is used for the handle as well for the device layer prevents charge buildup and allows the devices and the handle to be electrically connected and driven. The fabrication approach will be to:

1. Top: Delineate the wires that make up the deflection system onto the device layer
2. Back: Etch a "release" window though the handle.

This is accomplished with a combination of masking and deep reactive ion etching steps (DRIE) for both the device (front) and the window (back), shown in FIGS. 9a–9e. MEMS devices are routinely now manufactured using this tool and the technology is commercial. As shown in FIG. 9, a mask 102 with a pattern for forming the gate and contact electrodes of the BMD is formed on the silicon layer 100a of a silicon-on-insulator wafer 100. The exposed portions of silicon layer 100a are then etched away to form fingers of the BMD gate, where preferably each finger is connected to a corresponding contact electrode so that each of said at least some of the fingers is individually addressable electrically separately from other fingers. The insulator layer 100b is used as an etch stop in this process. A mask 104 is the formed on the bottom surface of the handle layer 100c, and the exposed portions of handle layer 100c are then etched away to form a window, again using insulator layer 100b as an etch stop in this process. The portions of the insulator layer in the window are then removed. To etch away the $SiO_2$ buried-oxide insulator layer, an HF-based etchant that has selectivity against aluminum is used. This leaves silicon fingers that are free standing except for their connections at their roots to the contact electrodes. The silicon layer 100a may be pre-coated with a metallic layer such as aluminum for improved conductive properties and to reduce static charge buildup.

In one embodiment, the fingers form two arrays or sets: 100a(1) and 100a(2) (see FIG. 11B), with one set 100a(1) connected to first contact electrode 100(1), and a second set 100a(2) connected to a second contact electrode (not shown in FIG. 11B), where the two contact electrodes form a frame for the two sets of electrodes, with each set of fingers connected to the frame on opposite sides of the frame. As is evident from FIG. 11B, each pair of fingers in the first array 100a(1) is separated by at least one finger in the second array 100a(2) and vice versa. Preferably adjacent fingers in the sets or arrays are spaced apart by less than about 0.1 mm and are in the range of 1 mm to 10 mm in length.

By applying the appropriate voltages to the two contact electrodes (e.g. 100(1)), the BMD using the device 100 after the processing described can modulate the ion beam passing through it into the "on" and "off" states as desired.

Alternatively, where each finger of at least some of the fingers is connected to a corresponding contact electrode so that each of said at least some of the fingers is individually addressable electrically separately from other fingers, it is possible to apply different voltages to such contact electrodes to more finely control the potential gradients experienced by the ions in the beam.

Experimental Section

This experimental description discusses the masks used, and the processes used for frontside and backside machining. The frontside machining is straight forward, but the backside machining requires some frontside protection scheme for the devices on the top not to be damaged. The protection scheme allows the backside of the wafer to be processed on equipment that is designed for only topside machining. Also it protects the equipment from being damaged by accidentally puncturing the device layer when doing long deep etches.

Masks Design:

Several device types were designed with a variety of distances between electrodes and electrode widths. The electrode width/electrode spacing combinations designed in the first generation mask are 3 μm/12 μm, 5 μm/20 μm, 10 μm/40 μm and 20 μm/80 μm. In all cases the active area, that is, the area of the device exposed to the ion beam is a 5 mm by 5 mm square window. The devices are essentially 15 mm×15 mm×400 μm silicon squares with windows exposing electrodes from the back. The electrodes are Al-coated silicon beams insulated from the silicon bulk body by an insulating 500nm $SiO_2$ glass layer. The designed mask has provisions for different mounting schemes, including holes for either glass fiber or ruby ball type of alignment. This will allow stacking several optical elements that share the same mounting scheme in an integrated ion modulation column that will include micro-fabricated lenses and grids. FIG. 10a is a perspective view of a mechanical design of a Beam Modulation device (not including wires). The masks 102 were drawn using Tanner's L-Edit software. As an example, FIGS. 10b and 10c show schematically a detail of the mask used to delineate features in the front side for the device in FIG. 10a. FIG. 10c is an exploded view of a portion 10c of the mask in FIG. 10b. The shaded areas of the mask in FIG. 10c illustrate the exposed areas of the silicon layer 100a that are etched away to form the fingers and contact electrodes, and the remaining areas illustrate the covered portions of layer 100a for forming the fingers and contact electrodes.

Front Side Machining:

The first step to delineate the fingers or wires onto the frontside of the SOI wafer is a deposition of an Aluminum layer. Prior to deposition the wafers are thoroughly cleaned using a standard cleaning procedure to get rid of organics, metals and the native oxide layer present in the Si surface. Good cleaning maximizes adhesion of the metal to the wafer. A 10 minute dip in a 90° C. 4:1 $H_2SO_4/H_2O_2$ mixture oxidizes any organic material in the wafer. Following a several-cycle rinse in de-ionized (DI) water, wafers are immersed for 10 minutes in a 5:1:1 $H_2O/HCl/H_2O_2$ solution at 70° C. After another DI water rinse, wafers are striped of "native" silicon oxide employing a 15 minute dip in a 50:1 $HF/H_2O$. Finally, wafers are rinsed until wash water has more than 18 MOhm resistance and then spin dried.

Titanium and Aluminum are deposited on the clean wafers to form a layer onto which the electrodes will be patterned. The deposition is carried over in a Gryphon metal sputtering system. Wafers are loaded into the system and their surfaces are further cleaned using ion milling to clear about 70 Å of material. A 0.5 μm layer of Ti is deposited at an argon gas base pressure of $1.7\times10^{-7}$ Torr at 2 kW power for 240 seconds. A 2 μm layer of Al is then deposited at a pressure of $2.4\times10^{-3}$ Torr at 7.5 kW power for 1200 seconds.

Once the wafers are metal coated, they are dehydrated at 150° C. for 30 minutes and primed with hexamethyldisilazane (HMDS) to improve photoresist adhesion. A 1.6 μm-thick layer of Shipley 3612 resist is spun on the wafers. Using a Karl Suiss MA-6 contact aligner, the wafers are exposed for 1 second using the top mask (λ=365 nm, 15 mW/cm²). Afterwards, developed using Shipley LDD-26W developer for 180 seconds and hard-baked for 90 seconds at 115° C. to strengthen the resist.

Aluminum is then wet-etched for 3 seconds using photoresist as the mask. The aluminum etchant (AL-11) consists of 72% $H_3PO_4$, 3% $HNO_3$, 3% acetic acid and 12% of water (Cyantek Corp.). The wafers are then rinsed with DI water and immersed in a 5:1:1 $H_2O/H_2O_2/NH_4OH$ solution to etch the remaining titanium layer. Afterwards, the wafers are rinsed and spin dried until 18MΩ resistance is achieved on the wash water.

At this point features are already patterned on the top layer by the remaining Al/Ti layer. Using this layer as a mask, the fingers or wires are defined by deep reactive ion etching on a STS ICP Multiplex $SF_6$ plasma etcher. FIGS. 11a and 11b show in detail the resulting structures after etching the electrodes on the top using $SiO_2$ layer 100b as an etch stop. FIG. 11b is an exploded view of a portion 11b of the mask in FIG. 11a. The shaded areas of the wafer 100 in FIG. 11b illustrate the exposed glassy areas of the $SiO_2$ layer 100b, and the remaining clear areas illustrate the portions of layer 100a forming the fingers and contact electrodes.

The process used is based on the standard etch/passivation Bosch process and etched trenches on the device layer that reach the underlying buried oxide layer in 32 min. If resist particles are still found on the wafer, the wafer is subjected to a 4 minute clean in a oxygen-plasma asher and a subsequent wet resist strip using a PRX-127 (SVC Corp.) bath. Both these resist strip steps not only remove photoresist itself, but also remove polymers left in the sidewalls of the fingers or wires by the Bosch process passivation steps.

Back Side Machining:

As mentioned, the first step in machining the backside is protecting the frontside from scratches and protecting the equipment from the processes happening in the backside. For this the wafers are cleaned and primed with HMDS. The frontside is protected with thick layer of SPR220-7 resist spun for 5 seconds at 500 rpm. Following coating the resist is baked to enhance stickiness for 30 minutes at 110 C. After cooling, the exposed backside of the wafer 100 is coated with a 7 μm layer of SPR220-7 photoresist 104 followed by overnight aging to improve resolution. Using a Karl Suiss MA-6 contact aligner, the mask is aligned with the features on the topside of the wafer and expose for 13 seconds (λ=365 nm, 15 mW/cm²). After exposure, the wafers are baked for 45 minutes at 110° C. to harden the resist so it withstands the long deep etch and developed using Shipley LDD-26W developer for 5 minutes. A carrier wafer is first manually coated with a 1.6 µm layer of Shipley 3612 resist and placed face up beneath the device wafers so that the flats are aligned. They are then pressed against each other for 1 hour in a 105° C. hotplate.

At this point the wafer is ready for a wafer-through etch using the spun resist as a mask. The back window is then etched for 4 hours in 30 minutes increments using the oxide layer as an endpoint and using the same process to etch the fingers or wires on the frontside. The wafer is then soaked in acetone until the two wafers are separated. From now on, the mechanical stability of the wafer is compromised, so no further processing in automated equipment is done because of the force exerted by vacuum chucks. The released wafer is then carefully cleaned using a resist strip using a PRX-127 (SVC Corp.) bath. FIGS. 12a and 12b show the backside of the device when the oxide and the resist have not been stripped. In the last major machining step, a window is etched from the back of the wafer 100 to expose the finger shaped electrodes from the back. Once etching is finished, the creased resist is still in place and the wires can be seen through the SiO2 glass layer (FIG. 12a). The electrodes can be focused on, at the bottom of the etched window (FIG. 12b). Following the resist strip the wafer is rinsed and the remaining oxide was etched away. To etch away the $SiO_2$ buried-oxide layer, an HF-based etchant that has selectivity against aluminum is used. 'Pad-etch' is an HF based etchant containing acetic acid and only etches about 400 Å in the first few minutes (up to 700 Å after 30 minutes); followed by a poorly characterized passivation process that prevents further metal corrosion. On the other hand, $SiO_2$ etches at a constant rate of at least 220 Å/min for the hardest thermal oxides.

Final Processing, Dicing and Packaging

Once the devices, still in the wafer, have been released using the oxide wet etch, they are air dried and easily break apart in individual dies. The drying process is still under development and is the major cause for low yield at this point. The BMDs can be stacked using sapphire balls to form assemblies or to include guard electrodes. For electrical testing, still underway, devices are wire bonded to 84-pin ceramic leadless chip carriers (LCC) and mounted on bakeable burn-in sockets.

FIGS. 13a–13j are cross-sectional views of a silicon-on-insulator wafer undergoing processing, forming a flow chart illustrating a more complete overall fabrication process for new beam modulation devices, such as the finished micromachined charged particle optical devices 100'.

Our experiments with conventional BNGs show a unique potential for implementing fast and accurate ion gates. We have completed the design and specification of the new devices, and have made calculations that predict that the performance of these gates will easily surpass that of the prior BNG designs. A process flow has been developed and tried successfully to micromachine these devices. Mechanical design as well as fabrication of prototypes has been successfully achieved. A general method for fabrication of ion optical devices based on SOI micromachining technology has been demonstrated. We are strongly confident that they will prove decisive in the pursuit of novel high-duty cycle mass spectrometry methods.

New ion optical devices may be designed based on microfabrication, to take advantage of their compact and low-voltage nature. The predicted advantages arising from micromachining will open the way to automated production of more efficient BNGs and other optical elements. The applications of these ion optical elements is not limited to time-of-flight mass spectrometry, but could become of common use in a variety of situations that require highly packed, high lensing power, low voltage ion and/or electron manipulation. The different applications using the micromachined charged particle optical devices are explained below.

FIGS. 14–19b are schematic views of systems using the above-described micromachined charged particle optical device 100'. As shown in FIG. 14, a charged particle beam is passed through device 100', which is turned on or off in the manner described above. The charged particles pass through undeflected to detector 200 when device 100' is in the "on" state. In the "off" state, device 100' causes the particles to be deflected to a shield or another detector 202. As in U.S. Pat. No. 6,870,157 noted above, device 100' can also be designed to cause the particles to be deflected during both states, where the detectors are placed accordingly to detect the deflected particles. In contrast to conventional designs where the BNG can have only two states ("on" and "off"), device 100' or a conventional BNG gate can be operated to have more than 2 states, as illustrated in FIGS. 15 and 16.

Instead of employing only one or two detectors as in FIG. 14, a linear array of detectors 204 may be used, where the array is spread in the direction of deflection of device 100' as shown in FIG. 15. A time sequence of preferably more than two sets of voltages are applied sequentially to the finger electrodes of device 100' (or wires of a conventional BNG), so that the charged particles in the beam are deflected by varying amounts, where these particles are detected by the array of detectors 204. In this manner, the resolution for detection of the particles may be improved. While detection of the spread of the particles in a single direction is illustrated in FIG. 15, the concept can be extended to a two dimensional detection scheme by employing two devices 100' with mutually transverse directions (preferably directions orthogonal to each other) of deflection as shown in FIG. 16. A two-dimensional position sensitive detector 206 is used to detect the particles. In addition to being used as a mass spectrometer as described above, device 100' can also be used as an ion mobility measurement device or spectrometer, by placing the BMD in a higher pressure environment, in a manner known to those skilled in the art.

A cascaded arrangement of two or more devices 100' (i.e. placed in tandem) can also be used to form a mass gate, which passes only particles with a given range of mass as shown in FIG. 17. Charged particles in a beam are passed to two or more devices 100' arranged to have substantially the same direction of deflection, where the voltages applied thereto are such that only mass within a certain given range will be allowed to pass. Thus, in one embodiment, the voltages applied to the second device 100' downstream from a first device 100' may be such that the second device 100' is turned to the "on " state that passes charged particles at a predetermined time after first device 100' changes from the "on" state to the "off" state. The particles that are able to travel from the first device to the second device within the predetermined time are thus allowed to pass, while other particles will be blocked. Since only particles with mass within a certain range will travel from the first device to the second device within the predetermined time, only particles with mass within a certain range will be allowed to pass both devices 100' in tandem. For a more detailed account of mass gates, please see Piyadasa, "A High Resolving Power Ion Selector for Post-Source Decay Measurements in a Reflecting Time-of-Flight Mass Spectrometer, *Rapid Commun. Mass Spectrom.* 12, pp. 1655–1664 (1998), especially FIGS. 4(g)–4(j) and the accompanying description.

A cascaded arrangement of two or more devices 100' can also be used to form a buncher, which converts a continuous beam of charged particles to bursts of particles as shown in FIG 18. A buncher works by grouping charge in time so that, in principle, total current is conserved to some extent. By applying a time-varying voltage, some particles catch up to particles downstream increasing the current at the detector at a given moment of time. In another family of devices, of which the normally-operated BNG might be a member of, are choppers that just do something (deflection) that effectively blocks ions from being in the beam at certain moments. Bunchers allow the user to achieve higher peak currents by piling up charges at a moment in time, while choppers just turn on and off a certain current value. Charged particles in a beam are passed to two or more devices 100' arranged to have substantially the same direction of deflection, where the voltages applied thereto are such that bursts of the particles are allowed to pass, either by causing the later arriving particles to catch up with the earlier arriving ones, or by blocking some of the particles. The "current" I of particles in the continuous beam is illustrated in FIG. 19a, prior to reaching the two devices 100' placed in proximity. The "current" I of particle in bursts after passing the devices is shown in FIG. 19B. For a more detailed account of buncher application, please see Dedman, "An Ion Gating, Bunching, and Potential Re-Referencing Unit", Review of Scientific Instruments, Volume 72, No. 7, July 2001, pp. 2915–2922, and more specifically, pp. 29 19–2930.

While the invention has been described above by reference to various embodiments, it will be understood that changes and modifications may be made without departing from the scope of the invention, which is to be defined only by the appended claims and their equivalent. All references referred to herein are incorporated by reference.

The invention claimed is:

1. An apparatus for analyzing a beam of charged particles, comprising:
    a layer of silicon material;
    a set of electrical contacts on the layer, said layer defining a set of electrically conducting silicon material fingers forming an array, wherein each of at least some of the fingers is connected electrically to one of the electrical contacts, wherein each of said at least some of the fingers is individually addressable electrically separately from other fingers;
    an insulator layer supporting said silicon layer;
    a handle layer supporting said insulator layer, so that when predetermined electrical potentials are applied to the electrical contacts, the at least some of the fingers will be substantially at said predetermined electrical potentials to modulate a beam of charged particles that passes through said array of fingers; and
    one or more detectors detecting the times of arrival of the particles in the beam of charged particles after it passes through said array of fingers.

2. The apparatus of claim 1, said set of contacts including a first and a second contact, wherein said set of silicon material fingers comprises a frame portion and a first and a second array of electrically conducting fingers, the fingers of the two arrays being connected to the frame portion on opposite sides of the frame portion, the fingers in the first array being electrically connected to the first electrical contact and the fingers in the second array being electrically connected to the second electrical contact.

3. The apparatus of claim 2, wherein each pair of fingers in the first array being separated by at least one finger in the second array.

4. The apparatus of claim 1, further comprising a layer of metallic material on said fingers.

5. The apparatus of claim 1, wherein adjacent fingers in the sets are spaced apart by less than about 0.1 mm and are in the range of 1 mm to 10 mm in length.

6. A mass spectrometer for analyzing a beam of charged particles, comprising:
    a layer of silicon material; and
    a set of electrical contacts on the layer, said layer defining a set of electrically conducting silicon material fingers forming an array, wherein each of at least some of the fingers is connected electrically to one of the electrical contacts and individually addressable electrically separately from other fingers; and
    one or more detectors the times of arrival of the particles in a beam of charged particles after it passes through said array of fingers.

7. The spectrometer of claim 6, said set of contacts including a first and a second contact, wherein said set of silicon material fingers comprises a frame portion and a first and a second array of electrically conducting fingers, the fingers of the two arrays being connected to the frame portion on opposite sides of the frame portion, the fingers in the first array being electrically connected to the first electrical contact and the fingers in the second array being electrically connected to the second electrical contact.

8. The spectrometer of claim 7, wherein each pair of fingers in the first array being separated by at least one finger in the second array.

9. The spectrometer of claim 6, further comprising a layer of metallic material on said fingers.

10. The spectrometer of claim 6, wherein adjacent fingers in the sets are spaced apart by less than about 0.1 mm and are in the range of 1 mm to 10 mm in length.

11. The spectrometer of claim 6, further comprising:
    an insulator layer supporting said silicon layer; and
    a handle layer supporting said insulator layer, so that when predetermined electrical potentials are applied to the electrical contacts, the at least some of the fingers will be substantially at said predetermined electrical potentials to modulate a beam of charged particles that passes through said array of fingers.

12. An apparatus for analyzing a beam of charged particles, comprising a plurality of devices, wherein each of the device modulates the beam so that the beam is deflected along a direction different from direction along which the beam is deflected by any of the remaining devices, wherein each of said plurality of devices comprises:
    a layer of silicon material;
    a set of electrical contacts on the layer, said layer defining a set of electrically conducting silicon material fingers forming an array, wherein each of at least some of the fingers is connected electrically to one of the electrical contacts; and
    one or more detectors detecting the times of arrival of the particles in a beam of charged particles after it passes through said array of fingers.

13. The apparatus of claim 12, wherein two of said plurality of devices deflect the beam in perpendicular directions.

14. The apparatus of claim 1, wherein the fingers in said two of said plurality of devices are substantially perpendicular to one another.

15. An apparatus for electrically modulating a beam of charged particles, comprising a plurality of devices, wherein each of said plurality of devices comprises:
    a layer of silicon material;

a set of electrical contacts on the layer, said layer defining a set of electrically conducting silicon material fingers forming an array, wherein each of at least some of the fingers is connected electrically to one of the electrical contacts; and a circuit that applies electrical potentials to the electrical contacts in the plurality of devices so that substantially only particles with a predetermined mass will pass through the plurality of devices.

16. An apparatus for electrically modulating a beam of charged particles, comprising a plurality of devices, wherein each of said plurality of devices comprises:

a layer of silicon material;

a set of electrical contacts on the layer, said layer defining a set of electrically conducting silicon material fingers forming an array, wherein each of at least some of the fingers is connected electrically to one of the electrical contacts; and a circuit that applies electrical potentials to the electrical contacts in the plurality of devices, said plurality of devices arranged so that bunches of particles pass intermittently sequentially through the plurality of devices, resulting in a higher electrical peak current than the beam prior to the modulation by the apparatus.

17. An ion mobility spectrometer, comprising:

a layer of silicon material;

a set of electrical contacts on the layer, said layer defining a set of electrically conducting silicon material fingers forming an array, wherein each of at least some of the fingers is connected electrically to one of the electrical contacts and individually addressable electrically separately from other fingers; and one or more detectors detecting the times of arrival of the particles in a beam of charged particles after it passes through said array of fingers.

18. The ion mobility spectrometer of claim 17, said set of contacts including a first and a second contact, wherein said set of silicon material fingers comprises a frame portion and a first and a second array of electrically conducting fingers, the fingers of the two arrays being connected to the frame portion on opposite sides of the frame portion, the fingers in the first array being electrically connected to the first electrical contact and the fingers in the second array being electrically connected to the second electrical contact.

19. The spectrometer of claim 18, wherein each pair of fingers in the first array being separated by at least one finger in the second array.

20. The spectrometer of claim 17, further comprising a layer of metallic material on said fingers.

21. The ion mobility spectrometer of claim 17, wherein adjacent fingers in the sets are spaced apart by less than about 0.1 mm and are in the range of 1 mm to 10 mm in length.

22. The ion mobility spectrometer of claim 17, further comprising:

an insulator layer supporting said silicon layer; and a handle layer supporting said insulator layer, so that when predetermined electrical potentials are applied to the electrical contacts, the at least some of the fingers will be substantially at said predetermined electrical potentials to modulate a beam of charged particles that passes through said array of fingers.

* * * * *

UNITED STATES PATENT AND TRADEMARK OFFICE
CERTIFICATE OF CORRECTION

| | | |
|---|---|---|
| PATENT NO. | : 7,176,452 B2 | Page 1 of 1 |
| APPLICATION NO. | : 11/107583 | |
| DATED | : February 13, 2007 | |
| INVENTOR(S) | : Zuleta et al. | |

It is certified that error appears in the above-identified patent and that said Letters Patent is hereby corrected as shown below:

Under Column 1:

• Please replace lines 4-6 with:

-- FEDERALLY-SPONSORED RESEARCH OR DEVELOPMENT
This invention was made with Government support under contract FA9550-04-C-0005 awarded by the Air Force Office of Scientific Research. The Government has certain rights in this invention. --

Signed and Sealed this
Nineteenth Day of April, 2011

David J. Kappos
*Director of the United States Patent and Trademark Office*